US012721077B2

(12) United States Patent
Liu

(10) Patent No.: US 12,721,077 B2
(45) Date of Patent: Aug. 25, 2026

(54) SLURRY RECYCLING FOR CHEMICAL MECHANICAL POLISHING SYSTEM

(71) Applicant: TAIWAN SEMICONDUCTOR MANUFACTURING CO., LTD., Hsinchu (TW)

(72) Inventor: Wen-Kuei Liu, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 767 days.

(21) Appl. No.: 17/591,423

(22) Filed: Feb. 2, 2022

(65) Prior Publication Data

US 2022/0157618 A1 May 19, 2022

Related U.S. Application Data

(62) Division of application No. 16/390,343, filed on Apr. 22, 2019, now Pat. No. 11,244,834.

(Continued)

(51) Int. Cl.

*B24B 37/005* (2012.01)
*B24B 1/00* (2006.01)

(Continued)

(52) U.S. Cl.

CPC .......... *H10P 52/403* (2026.01); *B24B 37/005* (2013.01); *B24B 37/042* (2013.01);

(Continued)

(58) Field of Classification Search

None

See application file for complete search history.

(56) References Cited

U.S. PATENT DOCUMENTS 5,647,989 A * 7/1997 Hayashi .................. B24B 57/02 210/651
5,664,990 A * 9/1997 Adams .................... B24B 57/02 451/36

(Continued)

FOREIGN PATENT DOCUMENTS

CN 1813340 A 8/2006
CN 102886308 A 1/2013

(Continued)

OTHER PUBLICATIONS

Machine Generated English Translation of the claims of KR2004004987A. Published Jun. 14, 2004 (Year: 2004).*

(Continued)

*Primary Examiner* — Sylvia Macarthur

(74) *Attorney, Agent, or Firm* — Sterne, Kessler, Goldstein & Fox P.L.L.C.

(57) ABSTRACT

The present disclosure describes an apparatus and a method for a chemical mechanical polishing (CMP) process that recycles used slurry as another slurry supply. The apparatus includes a pad on a rotation platen, a first feeder and a second feeder where each of the first and the second feeder is fluidly connected to a respective flow regulator and configured to dispense a first and a second slurry on the pad, a flotation module configured to provide a recycled slurry, and a detection module configured to detect a polishing characteristic associated with polishing the substrate. The flotation module further includes an inlet configured to provide a fluid sprayed from the pad and a tank configured to store chemicals that include a frother and a collector configured to chemically bond with the fluid.

20 Claims, 9 Drawing Sheets

Related U.S. Application Data

(60) Provisional application No. 62/741,298, filed on Oct. 4, 2018, provisional application No. 62/712,386, filed on Jul. 31, 2018.

(51) Int. Cl.

| | |
|---|---|
| ***B24B 37/04*** | (2012.01) |
| ***B24B 49/12*** | (2006.01) |
| ***B24B 57/02*** | (2006.01) |
| ***C09G 1/02*** | (2006.01) |
| ***H10P 52/40*** | (2026.01) |

(52) U.S. Cl.
CPC ............ *B24B 37/044* (2013.01); *B24B 49/12* (2013.01); *B24B 57/02* (2013.01); *C09G 1/02* (2013.01); *H10P 52/402* (2026.01)

(56) References Cited

U.S. PATENT DOCUMENTS 6,117,779 A * 9/2000 Shelton ................... B24B 37/04 438/692
6,257,965 B1 * 7/2001 Kamikubo ............. B24B 37/04 451/6
6,447,369 B1 * 9/2002 Moore .................... B24B 49/04 451/60
6,482,325 B1 * 11/2002 Corlett .................... C02F 1/463 451/60
6,558,238 B1 * 5/2003 Crevasse ................ B24B 57/02 451/446
6,656,359 B1 * 12/2003 Osuda ..................... B24B 55/12 210/639
6,758,723 B2 7/2004 Kobayashi et al.
6,913,514 B2 * 7/2005 Kimura ................ B24B 37/205 451/6
7,166,014 B2 * 1/2007 Benner ................... B24B 49/18 438/690
8,025,732 B2 * 9/2011 Sakurai ............... H01L 21/6708 118/725
8,172,641 B2 * 5/2012 Ho ........................ B24B 37/015 451/7
8,696,404 B2 * 4/2014 Sun ......................... B24B 57/02 210/651
10,017,675 B2 * 7/2018 Takahashi .......... B01D 11/0246
10,293,454 B2 * 5/2019 Nakayama ............ B24B 41/002
10,562,147 B2 * 2/2020 Butterfield .............. B24B 49/12
10,850,365 B2 * 12/2020 Sato ........................ B24B 37/00
11,642,754 B2 * 5/2023 Liu ......................... B24B 37/26 451/288
12,017,322 B2 * 6/2024 Cheng ............... H01L 21/31053
2002/0045349 A1 * 4/2002 Rhoades ................. B24B 37/04 438/689
2002/0108861 A1 * 8/2002 Emesh .................... B24B 37/20 204/229.4
2002/0195424 A1 12/2002 Tanaka
2003/0148706 A1 * 8/2003 Birang .................. B24B 37/013 451/6
2006/0025049 A1 2/2006 Sun
2011/0048542 A1 * 3/2011 Weinstock ............. B24B 57/00 137/551
2011/0070811 A1 * 3/2011 Neuber .................. B24B 57/00 451/60
2012/0289133 A1 * 11/2012 Liu ......................... B24B 37/34 451/443
2013/0140218 A1 * 6/2013 Dobby ................. B03D 1/1412 209/164
2013/0306525 A1 * 11/2013 Kramer .................. G05B 13/04 209/168
2020/0039028 A1 * 2/2020 Peng ..................... B24B 37/107
2020/0043748 A1 2/2020 Liu et al.
2020/0070308 A1 * 3/2020 Liu ......................... B24B 37/04
2022/0157618 A1 * 5/2022 Liu ......................... B24B 49/12

FOREIGN PATENT DOCUMENTS

| | | | | | | |
|---|---|---|---|---|---|---|
| CN | 103586754 | A | | 2/2014 | | |
| CN | 105313015 | A | | 2/2016 | | |
| CN | 105382678 | A | | 3/2016 | | |
| JP | H10233421 | A | * | 9/1998 | ........... | B24B 37/013 |
| JP | 2008-013851 | A | | 1/2008 | | |
| KR | 10-2004-0049877 | A | | 6/2004 | | |
| KR | 20040049877 | A | * | 6/2004 | | |
| KR | 101387917 | B1 | * | 4/2014 | ............. | B24B 37/04 |
| WO | WO-2008020507 | A1 | * | 2/2008 | ............. | B24B 37/00 |
| WO | WO-2010111291 | A2 | * | 9/2010 | ........... | B01D 61/142 |

OTHER PUBLICATIONS

Achine Generated English Translation of the description of KR2004004987A. Published Jun. 14, 2004 (Year: 2004).*

Chinese Office Action, dated Aug. 12, 2021, for Chinese Intellectual Property Office Appl. No. 201910671717.1, 9 pages.

H. Xiao, Introduction to Semiconductor Manufacturing Technology, SPIE Press, 2012, ISBN 978-0-8194-9092-6, pp. 522-523. (Year: 2012).

* cited by examiner

300

500

600

| | | Polishing process's stage | | |
|---|---|---|---|---|
| | | Ramping | Main Polishing | Cleaning |
| Flow rate percentage | First slurry supply | $1-a_1$ | $1-a_2$ | $1-a_3$ |
| | Second slurry supply | $a_1$ | $a_2$ | $a_3$ |

FIG. 6

SLURRY RECYCLING FOR CHEMICAL MECHANICAL POLISHING SYSTEM

RELATED APPLICATION

This application is a divisional of U.S. patent application Ser. No. 16/390,343, filed Apr. 22, 2019, titled "Slurry Recycling for Chemical Mechanical Polishing System," which claims the benefit of U.S. Provisional Patent Application No. 62/712,386, filed Jul. 31, 2018, titled "Method And Apparatus to Recycle Slurry For Chemical Mechanical Polishing Processes," and U.S. Provisional Patent Application No. 62/741,298, filed Oct. 4, 2018, titled "Slurry Control For Chemical Mechanical Polishing (CMP) System," which are incorporated by reference herein in their entireties.

BACKGROUND

Polishing semiconductor wafers with a chemical mechanical planarization (CMP) system requires a continuous supply of slurry. The continuous supply of slurry contributes to a significant cost of fabricating semiconductor devices.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 6 illustrates a chart for determining a first slurry supply and a second slurry supply for a polishing system, according to some embodiments.

DETAILED DESCRIPTION

Figure 1:
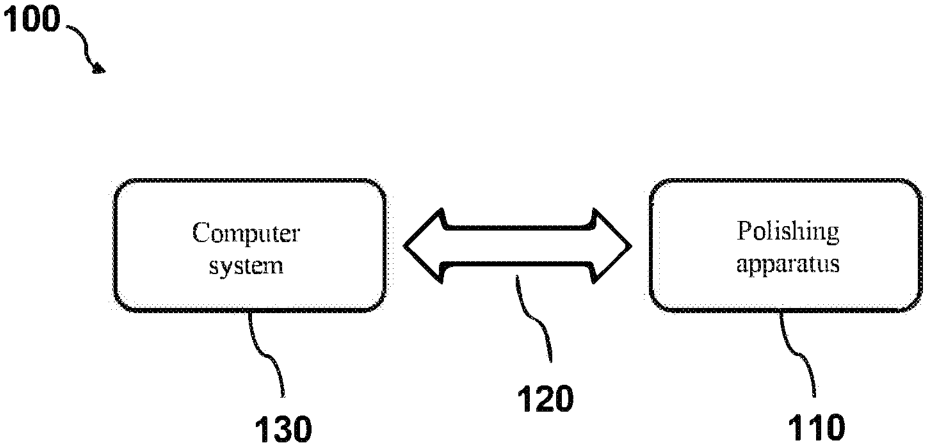
FIG. 1 illustrates a schematic of a polishing system, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Chemical mechanical planarization (CMP) is a planarization technique that can be used to planarize a wafer's surface by a relative motion between a wafer and a polishing pad in the presence of a slurry while applying pressure (e.g., a downforce) to the wafer. The slurry and the polishing pad are referred to as "consumables" because of their continual usage and replacement. For ease of reference, the CMP system is also referred to herein as a "polisher."

In the polisher, the wafer is positioned face down on a wafer holder, or carrier, and held against a polishing pad which is positioned on a flat surface referred to as a "platen." The polisher can use either a rotary or orbital motion during the polishing process. The CMP process achieves wafer planarity by removing elevated features relative to recessed features on the wafer surface.

The slurry is a mixture of abrasives and chemicals used to remove specific materials from the wafer's surface during the CMP process. Precise slurry mixing and consistent batch blends are critical for achieving wafer-to-wafer (WtW) and lot-to-lot (LtL) polishing repeatability (e.g., consistent polish rate, consistent polish uniformity across the wafer and across the die, etc.). The quality of the slurry is important so that scratches on the wafer surface are avoided during the CMP process.

The polishing pad attaches to a top surface of the platen. The polishing pad can be made, for example, from polyurethane due to polyurethane's mechanical characteristics and porosity. Further, the polishing pad can include small perforations to help transport the slurry along the wafer's surface and promote uniform polishing. The polishing pad also removes the reacted products away from the wafer surface. As the polishing pad polishes more wafers, the pad's surface becomes flat and smooth, causing a condition referred to as "glazing." Glazed pads cannot hold the polishing slurry—which significantly decreases the polishing rate.

Polishing pads require regular conditioning to retard the effects of glazing. The purpose of conditioning is to remove old slurry particles and abraded particles from the polishing pad to extend the polishing pad's lifetime and provide consistent polishing performance throughout its life. Polishing pads can be conditioned with mechanical abrasion or a deionized (DI) water jet spray that can agitate (activate) the pad's surface and increase its roughness. An alternative approach to activate the pad's surface is to use a conditioning wheel ("disk") featuring a bottom diamond surface that contacts the pad while it rotates.

To maintain yield and quality of wafer polishing for volume manufacturing, it is desirable to continuously flow fresh slurry onto the polishing pad during the CMP process. And, for CMP processes that require a high removal rate, a higher flow rate of fresh slurry onto the polishing pad is required. It is therefore necessary to prepare a large quantity of fresh slurry to operate the polisher.

As the pad rotates to polish the wafers, a portion of fresh slurry reacts with the wafer's surface. This reaction creates by-products including strayed particles from the polishing pad and reactants between the slurry and wafers. The un-reacted fresh slurry, the abrasives, and the by-products become waste that is sprayed off the edge of the polishing pad and carried away by a drain. The constant supply of fresh slurry and resulting waste result in a significant manufacturing cost and overhead (e.g., environment pollution) to operate the polisher.

The present disclosure is directed to an apparatus and a method for a CMP process that applies multiple slurries for a polishing process. In some embodiments, the multiple slurries include a first slurry and a second slurry. In some embodiments, the first slurry is a raw slurry, and the second slurry is a recycled slurry from the polishing process. A supply rate of each slurry can be adjusted based on a polishing characteristic of the polishing process. A benefit of the present disclosure is to reduce a slurry consumption and hence reducing manufacturing cost and overhead of operating the polisher.

FIG. 1 is a schematic of a polishing system 100 for a polishing process, in accordance with some embodiments of the present disclosure. As illustrate in FIG. 1, polishing system 100 can include a polishing apparatus 110, a communication link 120, and a computer system 130, where both polishing apparatus 110 and computer system 130 can be configured to communicate with each other via communication link 120. Polishing apparatus 110 can be configured to conduct a polishing process based on one or more instructions received from computer system 130. Polishing apparatus 110 can include multiple slurry feeders (not shown in FIG. 1) and a detection module (not shown in FIG. 1) configured to detect a polishing characteristic associated with the polishing process. The polishing characteristic can include one or more of a polishing rate, a surface roughness, a surface uniformity, a surface dishing, and a surface defect density of a substrate associated with the polishing process. Polishing apparatus 110 can be further configured to send data associated with the polishing characteristic to computer system 130. In some embodiments, polishing apparatus 110 can be a chemical mechanical polishing (CMP) apparatus. In some embodiments, communication link 120 can be a wire or wireless link between polishing apparatus 110 and computer system 130.

Computer system 130 can be configured to store the one or more instructions for the polishing process, where the one or more instructions can include one or more parameters of the polishing process such as a slurry's supply rate. Computer system 130 can be further configured to send the one or more instructions to polishing apparatus 110 via communication link 120. Computer system 130 can receive the detected polishing characteristic from polishing apparatus 110 and can be configured to generate an adjustment of the one or more parameters of the polishing process based on the detected polishing characteristic. In some embodiments, the adjustment can be generated based on another polishing characteristic detected by another ex-situ independent detection apparatus, such as stand-alone Atomic Force Microscopy (AFM). Computer system 130 can be further configured to update the one or more instructions based on the adjustment.

Figure 2:
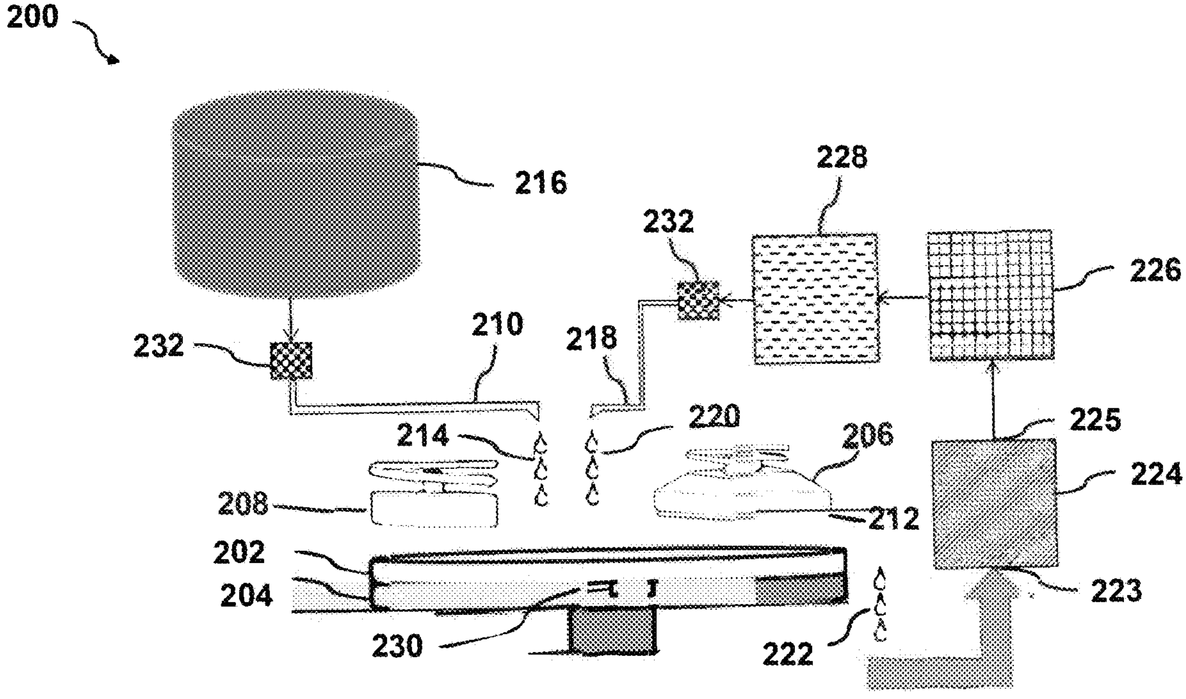
FIG. 2 illustrates a polishing apparatus, according to some embodiments.

FIG. 2 illustrates a polishing apparatus 200 (hereinafter "polisher 200"), according to some embodiments. Polisher 200 can be an embodiment of polishing apparatus 110. Polisher 200 can include a polishing pad 202 (hereinafter "pad 202") which is loaded on a rotating platen (e.g., a rotating table) 204. Polisher 200 can also include a rotating substrate carrier 206, a rotating conditioning wheel (or "disk") 208, a first slurry feeder 210 fluidly connected to a mixing tank 216 which mixes a fresh slurry, abrasives and DI water, and a second slurry feeder 218. For illustration purposes, FIG. 2 includes selected portions of polisher 200 and other portions (not shown) may be included, such as control units, transfer modules, pumps, drains, etc.

A substrate 212 to be polished is mounted face-down at the bottom of substrate carrier 206 so that the substrate's top surface contacts the top surface of pad 202. Substrate carrier 206 rotates substrate 212 and exerts pressure (e.g., a downforce) on it so that substrate 212 is pressed against rotating pad 202. A first fluid 214 and a second fluid 220 can be dispensed on the pad's surface, where first fluid 214 can be a mixture from mixing tank 216 and second fluid 220 can include a recycled slurry. Chemical reactions and mechanical abrasion between first fluid 214, second fluid 220, substrate 212, and pad 202 can result in material removal from the top surface of substrate 212. The removed materials are CMP by-products and are constantly sprayed off edge of pad 202 as a CMP waste 222. As a result, CMP waste 222 can further include the abrasives and an un-reacted slurry in first fluid 214 and second fluid 220. At the same time, conditioning wheel 208 can agitate the top surface of pad 202 to restore its roughness. However, this is not limiting and conditioning wheel 208 can condition pad 202 after substrate 212 has been polished and removed from polisher 200.

In some embodiments, polisher 200 can be configured to polish substrates with surfaces that include different types of materials, such as silicon, germanium, arsenic, nitrogen, oxygen, and metals.

In some embodiments, the slurry can be a mixture of chemicals that can include one or more abrasives, an oxidizer, a chelator, a surfactant, a corrosion inhibitor, a wetting agent, a removal rate enhancer, a biocide, a pH adjuster, and water. An ingredient of the slurry can be based on chemical components, such as silicon dioxide ($SiO_2$), aluminum oxide ($Al_2O_3$), cerium dioxide ($CeO_2$), carbon (C), silicon carbide (SiC), or titanium dioxide ($TiO_2$). Depending on the substrate polishing application, the one or more abrasives can include particles of $SiO_2$, $CeO_2$, $Al_2O_3$, zirconium oxide ($ZrO_2$), $TiO_2$, iron oxide ($Fe_2O_3$), zinc oxide (ZnO), or any other material.

In some embodiments, the physical and mechanical properties of pad 202 (e.g., roughness, material selection, porosity, stiffness, etc.) can depend on the material to be removed from substrate 212. For example, copper polishing, copper barrier polishing, tungsten polishing, shallow trench isolation polishing, oxide polishing, or buff polishing require different type of pads in terms of materials, porosity, and stiffness. The pads used in a polisher, like polisher 200, should exhibit some rigidity to uniformly polish the substrate surface. Pads, like pad 202, can be a stack of soft and hard materials that can conform to some extent to the local topography of substrate 212. By way of example and not limitation, pad 202 can be thermoset or thermoplastic. Pad 202 can also include urethane or porous polymeric materials with a pore size between about 1 μm and about 500 μm.

Referring to FIG. 2, polisher 200 can further include a flotation module 224 to recycle slurry from CMP waste 222, where flotation module 224 can include an inlet 223 and an outlet 225. CMP waste 222 generated from substrate polishing is collected and introduced into inlet 223 of flotation module 224. CMP waste 222 can react with chemicals in flotation module 224, where the chemicals can include a frother, a modifier, and a collector. The chemicals can perform a flotation process to remove most of CMP byproducts and abrasives from CMP waste 222, and therefore flotation module 224 can extract a recycled slurry from CMP waste 222. The recycled slurry is outputted at outlet 225 of flotation module 224 and is fluidly connected to second slurry feeder 218 as a source of second fluid 220. In some embodiments, flotation module 224 can include multiple inlets to receive CMP waste 222 and multiple outlets to output the recycled slurry.

In some embodiments, the recycled slurry from flotation module 224 is received by a filter module 226. Filter module 226 can include one or more filter elements to remove particles from the recycled slurry. For example, the one or more filter elements can be a resin or a filter paper to remove particles with a diameter larger than 0.5 μm. The filtered recycled slurry from filter module 226 can be received by a examination module 228 to examine chemical or physical properties of the filtered recycled slurry, which includes one or more of a conductivity, a chemical composition, a chemical concentration, and a pH value of the filtered recycled slurry. Depending on the properties of the filtered recycle slurry, a control unit associated with polisher 200 (not shown in FIG. 2) regulates and manages the amount of filtered recycled slurry received by second slurry feeder 218 as a source of second fluid 220.

Referring to FIG. 2, polisher 200 can further include a flow regulator 232 fluidly connected to each of first slurry feeder 210 and second slurry feeder 218. In some embodiments, flow regulator 232 can be fluidly connected between first feeder 210 and mixing tank 216. In some embodiments, flow regulator 232 can be fluidly connected between second feeder 218 and flotation module 224. Flow regulator 232 can be configured to control a flow rate of a slurry associated with first slurry feeder 210 or second slurry feeder 218. Flow regulator 232 can receive an input signal from a computer system and adjust a respective slurry flow rate according to the input signal. In some embodiments, flow regulator 232 can be manually controlled to adjust the respective slurry flow rate. Flow regulator 232 can be a two-port design to regulate/control the slurry flow rate. For example, flow regulator 232 can include an input port and an output port, where the input port is fluidly connected to a slurry source (e.g., mixing tank 216 or flotation module 224) and the output port dispenses the respective slurry on pad 202. In some embodiments, flow regulator 232 can be a mass flow controller, a flow control valve, a proportional valve, or a solenoid valve.

In some embodiments, flow regulator 232 can be a three or more port design to switch slurry flows between ports. For example, flow regulator 232 can have two input ports and one output port, where each of the input ports is fluidly connected to mixing tank 216 or flotation module 224 and the output port can be configured to dispense a slurry, either from mixing tank 216 or flotation module 214, on pad 202 (not shown in FIG. 2).

Referring to FIG. 2, polisher 200 can also include a detection module 230 configured to measure the polishing characteristic associated with a polishing process conducted by polisher 200. The polishing characteristic can include one or more of a polishing rate, a surface roughness, a surface uniformity, a surface dishing, and a surface defect density associated with substrate 212. In some embodiments, detection module 230 can be configured to measure the polishing characteristic during the polishing process. Detection module 230 can be an in-situ monitoring apparatus attached to or embedded in platen 204. In some embodiments, detection module 230 can be attached to substrate carrier 206. Detection module 230 can include an optical interferometer or an optical reflectometer to generate an optical signal directed towards substrate 212 and detect a respective optical reflectance signal associated with a thickness or a surface roughness of a film (e.g. a copper layer) on substrate 212. In some embodiments, detection module 230 can include an electrode structure configured to detect an electrical current associated with the film thickness on substrate 212. In some embodiments, detection module 230 can be an apparatus configured to measure one or more of a mechanic displacement, a force or torque, a vibration signal, an acoustic signal, a thermal signal, and a radioactivity signal associated with the polishing characteristic.

Figure 3:
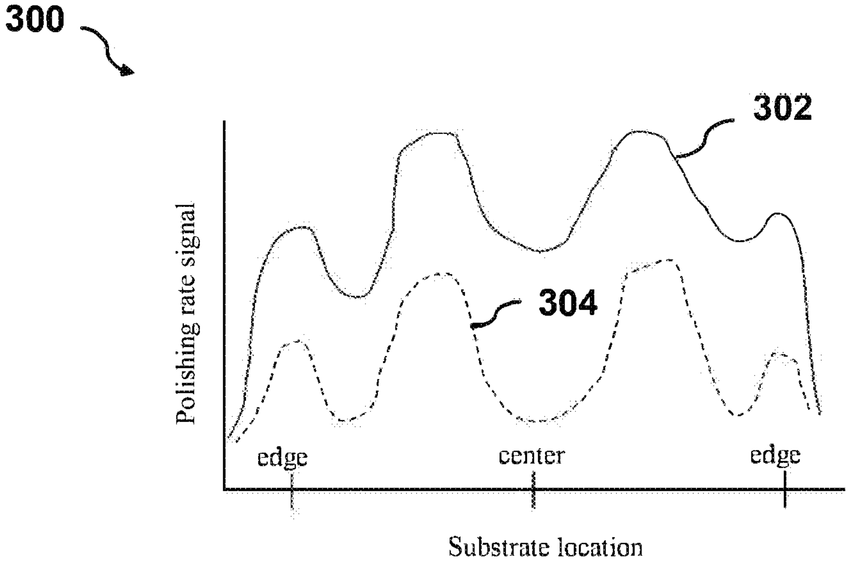
FIG. 3 illustrates a polishing rate data collected by a detection module, according to some embodiments.

FIG. 3 illustrates polishing rate data 300 collected by detection module 230, according to some embodiments. A horizontal and a vertical axis of data 300 represent a local portion (e.g., an edge portion or a central portion) of substrate 212 and a corresponding optical or electrical signal associated with a film profile (e.g., a film thickness or a surface contour) at the local portion of substrate 212, respectively. Signals 302 and 304 are measured optical or electrical signals at two different measurement times. Based on a vertical separation between signal 302 and 304, a respective polishing rate can be inferred. In some embodiments, signal 302 or 304 can itself be associated with one or more of a surface roughness, a surface uniformity, and a surface dishing of substrate 212 at the respective measurement time.

Figure 4A:
FIG. 4A illustrates a cross-sectional view of a flotation module, according to some embodiments.
Figure 4A:
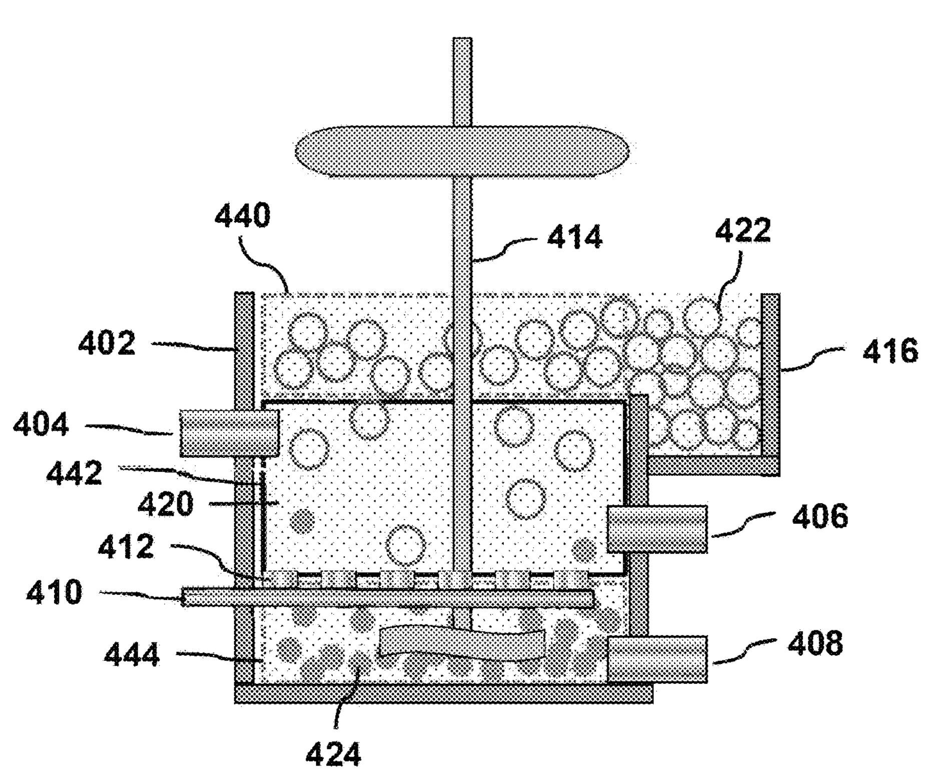

FIG. 4A is an isometric view of a flotation module 400, according to some embodiments. Flotation module 400 can be an embodiment of flotation module 224 of FIG. 2. Flotation module 400 can include an agitator 414 and a first tank 402, where first tank 402 includes a chemical fluid 420. Chemical fluid 420 can include de-ionized (DI) water, a frother, a collector, a modifier, or any combination thereof. First tank 402 can include a first inlet 404 to receive a CMP waste liquid containing slurry (e.g., CMP waste 222 from polisher 200), a first outlet 406 configured to output a recycled slurry from the CMP waste liquid, and a second outlet 408 fluidly connected to a drain (not shown in FIG. 4A) of polisher 200. Flotation module 400 can further include a second tank 416 fluidly connected to an upper portion 440 of first tank 402. Second tank 416 can be fluidly connected to a drain (not shown in FIG. 4A) to dispose chemical waste from first tank 402.

In some embodiments, first inlet 404 and first outlet 406 of FIG. 4A can be inlet 223 and outlet 225 of FIG. 2, respectively. In some embodiments, first outlet 406 and second outlet 408 can be located at a middle portion 442 and a bottom portion 444 of first tank 402, respectively. In some embodiments, first tank 402 can further include a second inlet 410 fluidly connected to a gas source (not shown in FIG. 4A), where a gas (e.g., air or inert gas) from the gas source is dispensed into first tank 402 via gas dispensers 412. In some embodiments, second inlet 410 can be located at bottom portion 444 of first tank 402.

Referring to FIG. 4A, flotation module 400 can be configured to perform a flotation process to convert the CMP waste liquid containing slurry (e.g., CMP waste 222) to a recycled slurry. The CMP waste liquid generated from substrate polishing is collected and received by first tank 402 via first inlet 404. In first tank 402, a portion of CMP by-products with heavy weight contained in the CMP waste liquid can start to sink and form precipitations 424 at bottom portion 444 of first tank 402. Precipitations 424 are discarded towards a drain of polisher 200 via second outlet 408. At the same time, agitator 414 can be configured to conduct an agitation to facilitate the frother to form bubbles in first tank 402 and promote the collector to react an other portion of CMP by-products in the CMP waste liquid to form intermediate molecules. The intermediate molecules can bond with the bubbles to form agglomerations 422. With the buoyancy of the bubbles, a majority of agglomerations 422 float toward upper portion 440 of first tank 402. A portion of agglomerations 422 further drift or diffuse to second tank 416 and are expelled to a drain (not shown at FIG. 4A) fluidly connected to second tank 416. As a result, a majority portion of the CMP waste (e.g., abrasives and CMP by-products) is removed from the CMP waste liquid by both precipitations 424 sinking down and agglomerations 422 floating up. Thus, the CMP waste liquid at middle portion 442 of first tank 402 includes less abrasives and CMP by-products and can be outputted as a recycled slurry via first outlet 406 of flotation module 400.

In some embodiments, the agitation can also promote the modifier to react the CMP by-products in the CMP waste liquid. The modifier can alter a hydrophobicity or hydrophilicity property of the CMP by-products, and hence releasing their tight-binding to surrounding water molecules. With less attraction to the surrounding water molecules, the converted CMP by-products can be easily captured by the collector to form the intermediate molecules.

In some embodiments, agitator 414 can include a fan in chemical fluid 420 and a bearing supporting the fan. The bearing can be coupled to a motion mechanism (not shown in FIG. 4A), such as pump or a motor, to rotate the fan. In some embodiments, agitator 414 can be an ultrasonic device or an oscillator device to facilitate the frother in first tank 402 to form bubbles.

In some embodiments, the gas introduced via second inlet 410 can be another source to facilitate the frother to form bubbles and promote the collector or the modifier to react with the CMP waste liquid.

In some embodiments, flotation module 400 can further include a heating device to control a temperature of chemical fluid 420 in first tank 402. In some embodiments, the flotation process occurs at or above room temperature (e.g., 25° C.).

In some embodiments, the frother can be alcohol ($C_5H_{11}OH$), phenol ($C_6H_5OH$), wood oil including pinene ($C_{10}H_{16}$), terpineol ($C_{10}H_{17}OH$), citronellal ($C_{10}H_{18}O$), or any other suitable material. In some embodiments, the frother can be an organic or an inorganic material.

In some embodiments, the collector can be a molecule that forms a bond with the frother. In some embodiments, the collector can be a molecule that bonds with one or more oxygen bonds from molecules of the abrasives and another portion of CMP by-products. In some embodiments, the collector can be a fatty acid or a soap with a molecular structure that includes R—COOH or R—COO-M, where R represents a chain of hydrocarbon (e.g., $C_nH_{2n+1}$) and M represents metal (e.g., sodium (Na), potassium (K), or any other metal element). In some embodiments, the collector can be sodium dithiophosphate ($Na_3PS_2O_2$) or ethyl amine ($NC_2C_2H_5$). In some embodiments, the collector can be an organic or an inorganic material.

In some embodiments, the modifier can be a pH adjuster, such as sodium carbonate ($Na_2CO_3$), sodium hydroxide (NaOH), or any other suitable material. In some embodiments, the modifier can be a dispersant, such as sodium silicate ($Na_2SiO_3$), a molecule containing molecular structure of phosphate ($PO_3^-$), or any other suitable material. In some embodiments, the modifier can be an agglomerant, such as potassium alum ($KAl(SO_4)_2 \cdot 12H_2O$) or any other suitable material. In some embodiments, the modifier can be an inhibitor, such as sodium mercaptoacetate ($HSCH_2COONa$) or any other suitable material. In some embodiments, the modifier can be an activator, such as sodium carbonate or any other suitable material. In some embodiments, the modifier can be an organic or an inorganic material.

Figure 4B:
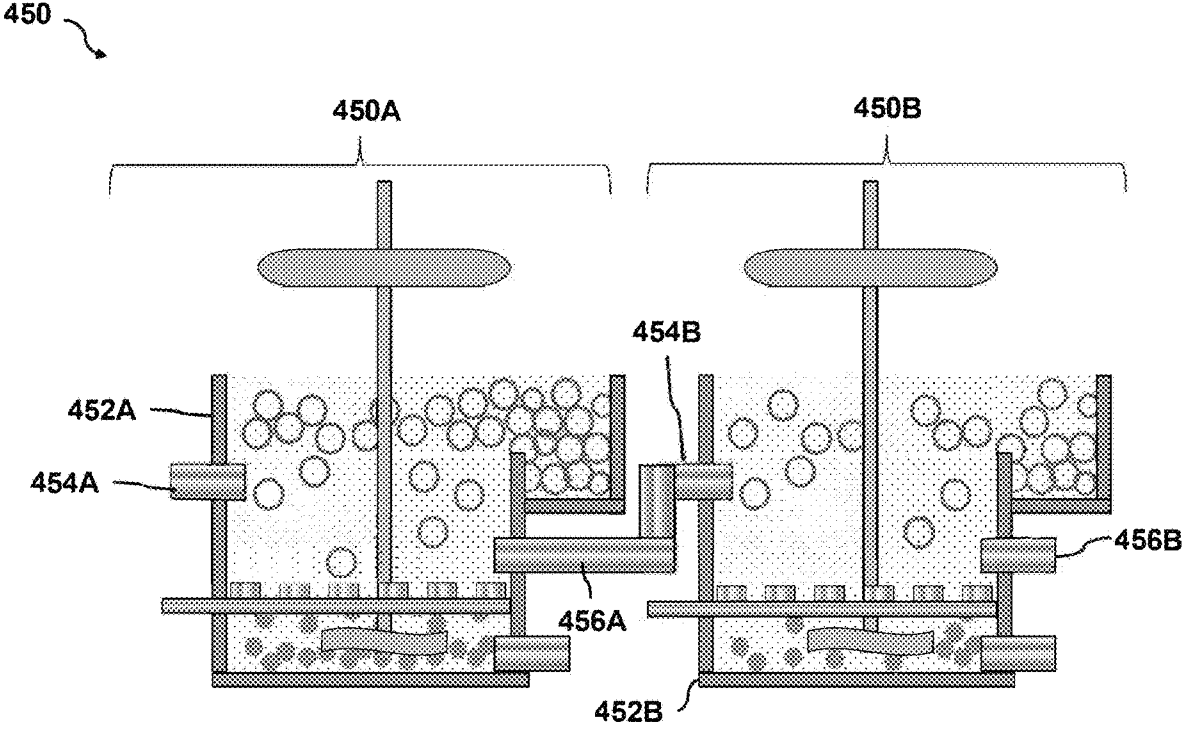
FIG. 4B illustrates a cross-sectional view of another flotation module, according to some embodiments.

FIG. 4B is a isometric view of a flotation module 450, according to some embodiments. Flotation module 450 can be an embodiment of flotation module 224 in FIG. 2. As shown in FIG. 4B, flotation module 450 can include a flotation module 450A fluidly connected to another flotation module 450B, where an outlet 456A of flotation module 450A is fluidly connected to an inlet 454B of flotation module 450B. Both flotation module 450A and 450B can have similar configurations and functionality as flotation module 400. A CMP waste liquid containing slurry (e.g., CMP waste 222) is received by flotation module 450A via an inlet 454A. A first recycled slurry from outlet 456A of flotation module 450A enters flotation module 450B via an inlet 454B. The final recycled slurry is outputted from flotation module 450B via an outlet 456B. The flotation process described above with respect to FIGS. 2 and 4A can be performed by each of flotation modules 450A and 450B. As a result, the final recycled slurry from flotation module 450B includes less CMP waste than the first recycled slurry. In some embodiments, flotation module 450 can fluidly connect more than two flotation modules 400 in series to output a recycled slurry with improved purity.

Figure 5:
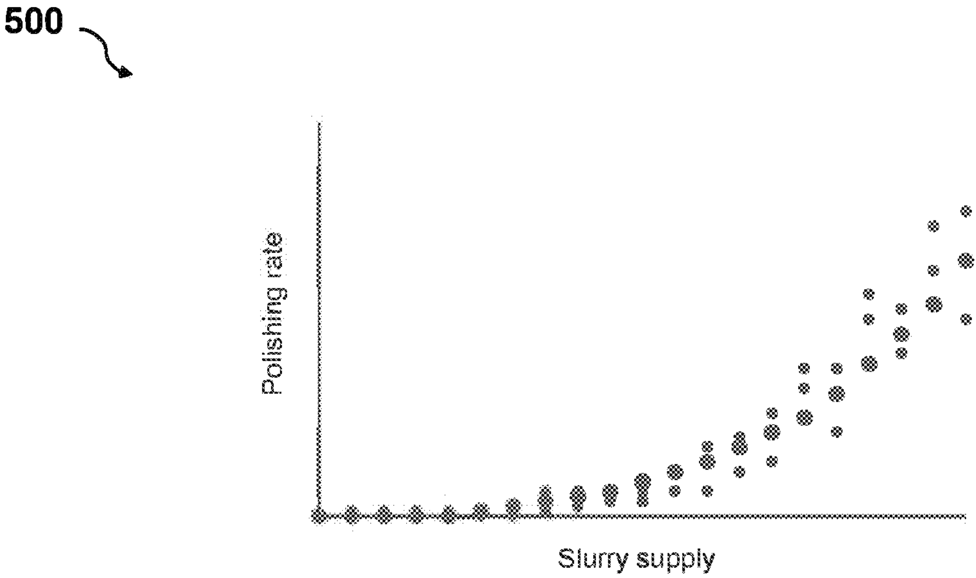
FIG. 5 illustrates a polishing rate characteristic of a polishing process with respect to a slurry supply, according to some embodiments.

FIG. 5 illustrates a polishing rate characteristic 500 of a polishing process with respect to a slurry supply, according to some embodiments. The slurry supply can be represented by a flow rate of a slurry supplied by first slurry feeder 210 and/or second slurry feeder 218, where the recycled slurry can be provided by floatation module 224 or another external supply source (e.g., recycled slurry is provided by a third-party.) Polishing rate characteristic 500 can be collected by detection module 230 as previously described in FIG. 3. As shown in FIG. 5, the polishing rate can monotonically increase as the respective slurry supply increases. In some embodiments, for a given slurry flow rate, a polishing rate provided by a raw slurry can be larger than that provided by a recycled slurry, where the recycled slurry can include less abrasives than the raw slurry.

FIG. 6 illustrates a chart 600 to determine a slurry supply of polishing system 100 based on one or more polishing characteristics of a polishing process conducted by polishing system 100, according to some embodiments. The polishing process can be configured to use a first slurry and a second slurry and can include a ramping, a main polishing, and a cleaning stage. The ramping stage can be configured to pre-condition a polishing pad (e.g., pad 202) by wetting the polishing pad's surface with a mixture of the first and second slurries. The main polishing stage can be configured to conduct a polishing activity for a target substrate (e.g., substrate 212) on the pre-conditioned polishing pad. The cleaning stage can be configured to remove by-products (e.g., CMP by-products), generated by the polishing activity, from the polishing pad's surface. In some embodiments, one or more of the ramping, the main polishing, and the cleaning stage can further include conditioning the polishing pad via a conditioning wheel. As shown in FIG. 6, during the ramping stage, a slurry supplied to the polishing pad can be a blended slurry mixed with the first and the second slurry, where a flow rate percentage of the first and second slurries is $(1-a_1)$ and $a_1$, respectively. Similarly, the flow rate percentage parameter of the respective blended slurry for the main polishing and the cleaning stage is $a_2$ and $a_3$, respectively.

Flow rate percentage $a_1$ can be determined based on one or more polishing characteristics, such as a surface uniformity, a surface dishing, a surface defect density of the resulting target substrate (e.g., substrate 212) after the polishing process. In some embodiments, flow rate percentage $a_1$ can be determined based on a pre-determined flow rate $a_2$ and $a_3$ (e.g. $a_2=0$, $a_3=0$). A specific flow rate percentage $a_1$ can be chosen if the one or more polishing characteristics are considered qualified (e.g., the target substrate exhibits a surface defect density below a pre-determined threshold). In some embodiments, a range of flow rate percentages $a_1$ can be chosen to provide qualified polishing characteristics. For example, any $a_1$ between 0.1 and 0.9 can generate qualified polishing characteristics. In some embodiments, if the second slurry (e.g., recycled slurry) has lower cost than the first slurry (e.g., fresh raw slurry), an upper bound of the wide range of flow rate percentage $a_1$ corresponding to qualified polishing characteristics is preferably chosen.

Flow rate percentage $a_2$ for the main polishing stage can be determined similarly to determining flow rate percentage $a_1$, according to some embodiments. Flow rate percentage $a_2$ can be further determined based on a polishing rate associated with the target substrate during the polishing activity. The polishing rate during the polishing activity can be measured by an embedded sensor similar to detection module 230 and compared to a pre-determined polishing rate. Flow rate percentage $a_2$ can be adjusted to eliminate a deviation between the measured and the pre-determined polishing rate. For example, the polishing rate associated with the polishing activity can be a superposition of each polishing rate characteristic (e.g., FIG. 5) of each of the first and second slurries. Therefore, by adjusting flow rate percentage $a_2$ to modify the blended slurry on the polishing pad, the polishing rate can be tuned accordingly. In some embodiments, the pre-determined polishing rate is chosen based on historical polishing processes similar or identical to the polishing process.

Flow rate percentage $a_3$ for the cleaning stage can be determined similarly to determining flow rate percentage $a_1$, according to some embodiments.

Figure 7:
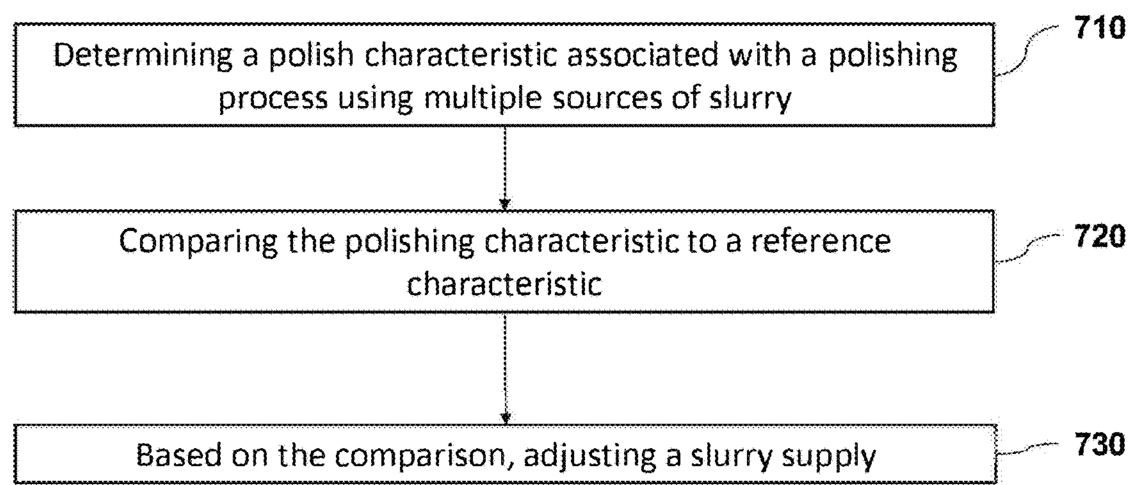
FIG. 7 illustrates a method for operating a polishing system, according to some embodiments.

FIG. 7 is an exemplary method 700 for operating a polishing system, in accordance with some embodiments of the present disclosure. Operations shown in the exemplary method 700 are not exhaustive; other operations can be performed before, after, or between any of the illustrated operations. In some embodiments, operations of the exemplary method 700 can be performed in a different order. Variations of the exemplary method 700 are within the scope of the present disclosure.

Exemplary method 700 begins with operation 710, where a polishing characteristic associated with a polishing process using multiple slurries is determined. The polishing process can be configured to polish a target substrate or condition a polishing pad. In some embodiments, the polishing process can include one or more of a ramping, a main polishing, and a cleaning stage. The polishing characteristic associated with the polishing process can include one or more of a polishing rate, a surface roughness, a surface uniformity, a surface contour, a surface dishing, and a surface defect density of a target substrate. The polishing characteristic can be determined by a detection module embedded in the polishing system, where the detection module can be configured to measure one or more of an optical reflection, an optical refraction, an optical scattering, and an electrical current associated with the polishing process. For example, the detection module can be an optical reflectrometer configured to transmit an optical signal towards the target substrate and receive a respective optical reflectance associated a polished film's profile on the target substrate. In some embodiments, the detection module can be an electrode structure configured to measure an electrical current from the target substrate associated with the polished film's thickness during the polishing process. In some embodiments, the polishing characteristic can be determined by an external detection module. For example, a surface roughness and/or dishing (e.g., a polishing characteristic) of the target substrate can be measured by a stand-alone atomic force microscopy (AFM) apparatus.

In some embodiments, the multiple slurries can include a first slurry, where the first slurry can be a fresh, raw slurry. In some embodiments, the first slurry can be mixed with deionized water or other chemicals such as hydrogen peroxide.

In some embodiments, the multiple slurries can also include a second slurry, where the second slurry can be a recycled slurry. In some embodiments, the recycled slurry can be extracted from a used slurry, collected from the polishing process, via the flotation process as described above. For example, the used slurry can be from a previous polishing process using the first slurry (e.g., the fresh, raw slurry), where the recycled slurry can be produced by recycling the used slurry during the previous polishing process via the flotation process. In some embodiments, the recycled slurry can be produced by recycling the used slurry from the current polishing process. In some embodiments, the recycled slurry can be provided by used slurry from an external third-party (e.g., purchase from a vendor.)

In operation 720, the polishing characteristic is compared to a reference characteristic. The reference characteristic can be one or more of a pre-determined polishing rate, a pre-determined threshold of surface roughness, and a pre-determined threshold of surface defect density of the target substrate associated with the polishing process. The reference characteristic can represent or be associated with a desired polishing result of the polishing process. For example, the reference characteristic can be a pre-determined threshold of substrate roughness that meets a product specification after the polishing process. For example, the polishing process maintained at the pre-determined polishing rate can be expected to generate the target substrate with desired surface uniformity or manufacturing throughput. In some embodiments, the reference characteristic can be determined or learned from one or more historical polishing processes similar or identical to the polishing process. The comparison between the polishing characteristic and the reference characteristic can include subtracting the polishing characteristic from the reference characteristic. In some embodiments, the comparison can include subtracting the polishing characteristic from an averaged attribute (e.g., an averaged surface roughness from one or more areas of the target substrate) of the reference characteristic.

In operation 730, a slurry supply is adjusted based on the comparison between the polishing characteristic and the reference characteristic. As discussed previously, a slurry can affect a polishing characteristic. Also, the polishing characteristic can be a superposition of individual polishing characteristics. For example, the polishing characteristic can be a weighted average of individual polishing characteristics, where each of the individual polishing characteristics is associated with a respective slurry of the multiple slurries. As a result, the adjustment can be configured to tune the blended slurry to alter the respective polishing characteristic to minimize a deviation between the respective polishing characteristic and the reference characteristic. For example, a polishing rate of the polishing process, using the first and the second slurry, can be significantly higher than the reference polishing rate. If the first slurry is associated with a higher polishing rate than the second slurry, the adjustment can include decreasing a flow rate of the first slurry or increasing a flow rate of the second slurry to lower the overall polishing rate. In some embodiments, the adjustment can be performed during the polishing process. In some embodiments, the adjustment can further include tuning a dispensing time of at least one of the multiple slurries.

In some embodiments, the adjustment can minimize a production cost associated with the polishing process. For example, a blending range of mixing the first and the second slurry can generate similar and qualified polishing characteristic. If the first slurry is a fresh slurry (e.g., the cost is expensive) and the second slurry is a recycled slurry (the cost is less expensive), the adjustment can include decreasing a flow rate of the first slurry and increasing a flow rate of the second slurry such that an overall cost of the modified blended slurry is reduced but still can generate the similar and qualified polishing characteristic.

Figure 8:
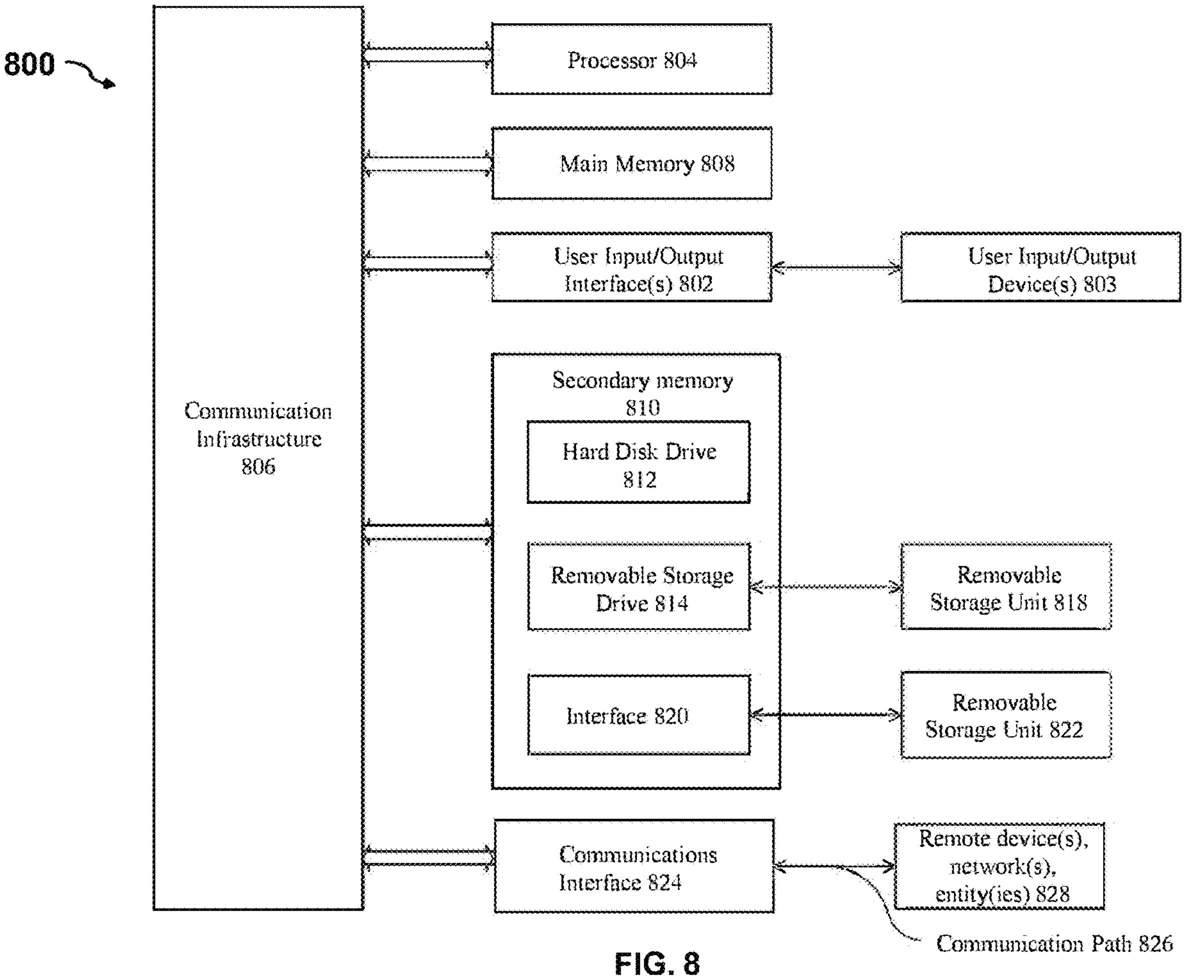
FIG. 8 illustrates a high-level block diagram of a computer system, according to some embodiments.

Various aspects of the exemplary embodiments may be implemented in software, firmware, hardware, or a combination thereof. FIG. 8 is an illustration of an example computer system 800 in which embodiments of the present disclosure, or portions thereof, can be implemented as computer-readable code. Various embodiments of the present disclosure are described in terms of this example computer system 800.

Computer system 800 can be an example of computer system 130, and can include one or more processors, such as processor 804. Processor 804 is connected to a communication infrastructure 806 (e.g., a bus or network).

Computer system 800 also includes a main memory 808, such as random access memory (RAM), and may also include a secondary memory 810. Secondary memory 810 can include, for example, a hard disk drive 812, a removable storage drive 814, and/or a memory stick. Removable storage drive 814 can include a floppy disk drive, a magnetic tape drive, an optical disk drive, a flash memory, or the like. Removable storage drive 814 reads from and/or writes to a removable storage unit 818 in a well-known manner. Removable storage unit 818 can include a floppy disk, magnetic tape, optical disk, flash drive, etc., which is read by and written to by removable storage drive 814. Removable storage unit 818 includes a computer-readable storage medium having stored therein computer software and/or data. Computer system 800 includes a display interface 802 (which can include input and output devices 803, such as keyboards, mice, etc.) that forwards graphics, text, and other data from communication infrastructure 806 (or from a frame buffer not shown).

In alternative implementations, secondary memory 810 can include other similar devices for allowing computer programs or other instructions to be loaded into computer system 800 (e.g. loaded into main memory 808). Such devices can include, for example, a removable storage unit 822 and an interface 820. Examples of such devices include a program cartridge and cartridge interface (such as those found in video game devices), a removable memory chip (e.g., EPROM or PROM) and associated socket, and other removable storage units 822 and interfaces 820 which allow software and data to be transferred from the removable storage unit 822 to computer system 800.

Computer system 800 can also include a communications interface 824. Communications interface 824 allows software and data to be transferred between computer system 800 and external devices. Communications interface 824 can include a modem, a network interface (such as an Ethernet card), a communications port, or the like. Software and data transferred via communications interface 824 are in the form of signals which may be electronic, electromagnetic, optical, or other signals capable of being received by communications interface 824. These signals are provided to communications interface 824 via a communications path 826. Communications path 826 carries signals and can be implemented using wire or cable, fiber optics, a phone line, a cellular phone link, a RF link, or other communications channels.

In this document, the terms "computer program storage medium" and "computer-readable storage medium" are used to generally refer to non-transitory media such as removable storage unit 818, removable storage unit 822, and a hard disk installed in hard disk drive 812. Computer program storage medium and computer-readable storage medium can also refer to memories, such as main memory 808 and secondary memory 810, which can be semiconductor memories (e.g., DRAMs, etc.). Embodiments of the present disclosure can employ any computer-readable medium, known now or in the future. Examples of computer-readable storage media include, but are not limited to, non-transitory primary storage devices (e.g., any type of random access memory), and non-transitory secondary storage devices (e.g., hard drives, floppy disks, CD ROMS, ZIP disks, tapes, magnetic storage devices, optical storage devices, MEMS, nanotechnological storage devices, etc.).

These computer program products provide software to computer system 800. Embodiments of the present disclosure are also directed to computer program products including software stored on any computer-readable storage medium. Such software, when executed in one or more data processing devices, causes a data processing device(s) to operate as described herein.

Computer programs (also referred to herein as "computer control logic") are stored in main memory 808 and/or secondary memory 810. Computer programs may also be received via communications interface 824. Such computer programs, when executed, enable computer system 800 to implement various embodiments of the present disclosure. In particular, the computer programs, when executed, enable processor 804 to implement processes of embodiments of the present disclosure, such as the operations in method 600 illustrated by FIG. 6, method 700 illustrated by FIG. 7. Where embodiments of the present disclosure are implemented using software, the software can be stored in a computer program product and loaded into computer system 800 using removable storage drive 814, interface 820, bard drive 812, or communications interface 824.

The functions/operations in the preceding embodiments can be implemented in a wide variety of configurations and architectures. Therefore, some or all of the operations in the preceding embodiments—e.g., functions of polishing system 100 described in FIG. 1, functions of polishing apparatus 200 described in FIG. 2, functions of flotation module 400 described in FIG. 4A, method 600 illustrated by FIG. 6, and method 700 described in FIG. 7—can be performed in computer system 800 (e.g. by processor 804), in hardware, in software or in combination thereof. In some embodiments, a tangible apparatus or article of manufacture including a tangible computer useable or readable medium having control logic (software) stored thereon is also referred to herein as a computer program product or program storage device. This includes, but is not limited to, computer system 800, main memory 808, secondary memory 810 and removable storage units 818 and 822, as well as tangible articles of manufacture embodying any combination of the foregoing. Such control logic, when executed by one or more data processing devices (such as computer system 800), causes such data processing devices to operate as described herein. For example, the hardware/equipment can be connected to or be part of element 828 (remote device(s), network(s), entity(ies) 828) of computer system 800.

The present disclosure provides a polishing apparatus and a method for a polishing process that uses multiple slurries including a raw/fresh slurry and a used slurry recycled from the polishing process. According to some embodiments, the apparatus can include a flotation module to recycle the used slurry, which contains CMP waste. In some embodiments, the flotation module can include chemicals to conduct a flotation process to separate the CMP waste from the used slurry, where the chemicals can include a frother, a collector, and a modifier. A supply rate of each of the multiple slurries can be adjusted based on a comparison between a polishing characteristic associated with the polishing process with a reference characteristic. Such polishing apparatus equipped with the flotation module can cut the amount of slurry consumption, thus reducing manufacturing cost and overhead of operating the polishing apparatus.

In some embodiments, a polishing system for polishing a substrate can include a pad on a rotation platen, a first feeder and a second feeder, a flotation module configured to provide a recycled slurry, and a detection module configured to detect a polishing characteristic associated with polishing the substrate. Each of the first and the second feeders can be fluidly connected to a respective flow regular and configured to dispense a respective first and a second slurry on the pad. The flotation module can include an inlet configured to receive a fluid sprayed from the pad, and to tank configured to store chemicals that can include a frother and a collector configured to chemically bond with the fluid.

In some embodiments, a method for operating a polishing system can include determining a polishing characteristic associated with a polishing process using a first slurry and a second slurry, comparing the polishing characteristic to a reference characteristic, and based on the comparison, adjusting a respective slurry rate of one or more of the first and the second slurry.

In some embodiments, a method for operating a polishing system can include conducting a first polishing process using a first slurry, recycling the first slurry during the first polishing process to produce a second slurry, supplying the first slurry with a first supply rate and the second slurry with a second supply rate to conduct a second polishing process, determining a polishing rate associated with the second polishing process, comparing the polishing rate to a reference polishing rate, and adjusting at one of the first supply rate and the second supply rate for the second polishing process based on the comparison.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A polishing apparatus for polishing a substrate, comprising:

a rotating platen having a pad thereon;

first and second flow regulators;

first and second feeders fluidly connected to the first and second flow regulators respectively, the first and second feeders configured to dispense respective first and second slurries onto the pad;

a flotation module configured to provide a recycled slurry, the flotation module comprising:

a tank configured to store a plurality of chemicals to react with a waste liquid;

a first inlet coupled to a middle portion of the tank and configured to receive the waste liquid from the pad;

a second inlet coupled to a bottom portion of the tank and configured to provide a gas into the tank;

a first outlet coupled to the middle portion of the tank and configured to output the recycled slurry from the tank; and a second outlet coupled to the bottom portion of the tank and configured to output precipitations sinking at the bottom portion of the tank; and a detection module embedded in the rotating platen, wherein the detection module comprises an electrode configured to detect an electrical current associated with a thickness of a film on the substrate.

2. The polishing apparatus of claim 1, wherein the second flow regulator is fluidly connected to the flotation module.

3. The polishing apparatus of claim 1, wherein each of the first and second flow regulators comprises one or more of a mass flow controller, a flow control valve, a proportional valve, and a solenoid valve.

4. The polishing apparatus of claim 1, wherein the detection module further comprises one or more of an optical reflectometer and an optical interferometer.

5. The polishing apparatus of claim 1, wherein the second feeder is configured to dispense the recycled slurry as the second slurry.

6. The polishing apparatus of claim 1, further comprising a mixing tank that includes the first slurry dispensed to the first feeder, an outlet of the mixing tank being fluidly connected to the first feeder.

7. The apparatus of claim 1, further comprising a filter coupled to the flotation module and the second feeder, wherein the filter is decoupled from the first feeder and configured to remove particles in the recycled slurry.

8. An apparatus, comprising:

a rotating platen;

a polishing pad on the rotating platen and configured to polish a substrate;

a first slurry feeder configured to dispense a first slurry on the polishing pad;

a second slurry feeder configured to dispense a second slurry on the polishing pad;

a flotation device coupled to the second slurry feeder and decoupled from the first slurry feeder, wherein the flotation device is configured to:

collect a polishing waste sprayed from the polishing pad; and recycle the polishing waste into the second slurry;

and wherein the flotation device comprises:

a first tank configured to separate the second slurry from the polishing waste;

a second tank coupled to a top portion of the first tank and configured to collect agglomerations produced by the first tank;

an inlet coupled to the first tank and configured to receive the polishing waste; and an outlet coupled to the first tank and configured to provide the second slurry to the second slurry feeder;

a detector attached to the polishing pad and configured to detect a polishing characteristic associated with polishing the substrate; and flow regulators configured to adjust flow rates of the first and second slurries based on the polishing characteristic.

9. The apparatus of claim 8, wherein the flotation device is further configured to form bubbles in the polishing waste by agitating the polishing waste with an inert gas.

10. The apparatus of claim 8, wherein the flotation device is further configured to precipitate a polishing by-product from the polishing waste.

11. The apparatus of claim 8, wherein the flotation device is further configured to remove polishing abrasives from the polishing waste.

12. The apparatus of claim 8, wherein the flow regulators are further configured to determine flow rate percentages of the first and second slurries based on a surface uniformity, a surface dishing, and a surface defect density of the substrate.

13. The apparatus of claim 8, wherein the polishing characteristic comprises one or more of a polishing rate, a surface roughness, a surface uniformity, a surface dishing, and a surface defect density.

14. The apparatus of claim 8, wherein the flotation device further comprises:

another inlet coupled to the first tank and configured to provide a gas into the first tank, wherein the other inlet is below the inlet; and another outlet coupled to the first tank and configured to output precipitations separated from the polishing waste, wherein the other outlet is below the outlet.

15. An apparatus, comprising:

a polishing pad configured to:

receive a raw slurry and a recycled slurry; and produce a waste liquid during a semiconductor process to polish a substrate;

a detector configured to detect a surface profile of the substrate during the semiconductor process to polish the substrate;

a first slurry feeder configured to dispense the raw slurry on the polishing pad;

a tank coupled to the first slurry feeder and configured to supply the raw slurry to the first slurry feeder;

a second slurry feeder configured to dispense the recycled slurry on the polishing pad;

a flotation device coupled to the second slurry feeder and decoupled from the tank, wherein the flotation device is configured to:

transform the waste liquid into the recycled slurry; and examine properties of the recycled slurry;

and wherein the flotation device comprises:

a first tank configured to extract the recycled slurry from the waste liquid;

a second tank coupled to the first tank and configured to collect agglomerations produced by the first tank;

a first inlet coupled to the first tank and configured to receive the waste liquid;

a second inlet coupled to the first tank and configured to provide a gas into the first tank;

a first outlet coupled to the first tank and configured to provide the recycled slurry to the second slurry feeder; and a second outlet coupled to the first tank and configured to output precipitations separated from the waste liquid; and a control device configured to regulate a flow rate of the recycled slurry provided to the second slurry feeder based on the properties of the recycled slurry.

16. The apparatus of claim 15, wherein the control device is further configured to compare the surface profile of the substrate to pre-determined reference characteristics.

17. The apparatus of claim 16, wherein the pre-determined reference characteristics comprise a reference polishing rate, a reference surface roughness, and a surface defect density.

18. The apparatus of claim 15, wherein the control device is further configured to:

determine a polishing rate of the semiconductor process; and based on the polishing rate, adjust the flow rate of the recycled slurry and a flowrate of the raw slurry.

19. The apparatus of claim 18, wherein, in response to the polishing rate being greater than a reference polishing rate, the control device is further configured to increase the flow rate of the recycled slurry and decrease the flow rate of the raw slurry.

20. The apparatus of claim 15, wherein:

the second tank is coupled to a top portion of the first tank;

the first inlet and the first outlet are coupled to a middle portion of the first tank; and the second inlet and the second outlet are coupled to a bottom portion of the first tank.

* * * * *